United States Patent
Bouton

(10) Patent No.: US 8,914,756 B2
(45) Date of Patent: Dec. 16, 2014

(54) PROCESS FOR FABRICATING AN INTEGRATED CIRCUIT COMPRISING AN ANALOG BLOCK AND A DIGITAL BLOCK, AND CORRESPONDING INTEGRATED CIRCUIT

(75) Inventor: Guilhem Bouton, Peynier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 341 days.

(21) Appl. No.: 13/287,347

(22) Filed: Nov. 2, 2011

(65) Prior Publication Data

US 2012/0104632 A1 May 3, 2012

(30) Foreign Application Priority Data

Nov. 3, 2010 (FR) ...................... 10 59054

(51) Int. Cl.
*G06F 17/50* (2006.01)
(52) U.S. Cl.
CPC .................. *G06F 17/5063* (2013.01)
USPC .......................... 716/100; 716/101
(58) Field of Classification Search
CPC ................. H01L 27/14687; H01L 27/14618; H01L 27/14632; H01L 27/14645; H01L 2924/1433; H01L 2924/19041; H01L 2924/19042; H01L 2924/19043; H01L 27/14692; H01L 2924/30105; H01L 27/14683; H01L 27/14627; B82Y 10/00; B82Y 20/00; G11B 9/14; B81C 1/00246; C23C 18/1225; C23C 18/1275; C23C 18/1295; G01R 31/001; G06F 17/5036; G06F 17/5063; H04R 17/02; H04R 19/00; H04R 2499/11; H04R 31/00
USPC .................................... 716/100–106
See application file for complete search history.

(56) References Cited

U.S. PATENT DOCUMENTS

| | | | | |
|---|---|---|---|---|
| 6,834,380 | B2 * | 12/2004 | Khazei ..................... | 716/115 |
| 7,984,408 | B2 * | 7/2011 | Cheng et al. ............... | 716/119 |
| 8,409,978 | B2 * | 4/2013 | Pagaila et al. ............. | 438/611 |
| 8,492,197 | B2 * | 7/2013 | Cho et al. ................. | 438/108 |
| 8,563,418 | B2 * | 10/2013 | Pagaila et al. ............. | 438/614 |
| 2010/0169848 | A1 | 7/2010 | Nahmanny et al. .......... | 716/3 |

OTHER PUBLICATIONS

Allan et al., "2001 technology roadmap for semiconductors", IEEE, vol. 35, No. 1, Jan. 2002, pp. 42-53.
Leenaerts et al. "CAD solutions and outstanding challenges for mixed-signal and RC IC design", IEEE ACM International Conference on Computer Aided Design, 2001, pp. 270-277.
Sheinman et al. "A comprehensive flow for transfer of designs between technologies" Microwaves, Communications, Antennas and Electronic Systems, May 2008, pp. 1-7.

* cited by examiner

*Primary Examiner* — Binh Tat
(74) *Attorney, Agent, or Firm* — Allen, Dyer, Doppelt, Milbrath & Gilchrist, P.A.

(57) ABSTRACT

The integrated circuit comprises an analog block and a digital block in and/or on the same substrate. At least part of a first integrated-circuit portion (BA2) corresponding to the analog block is produced in a native technology and a second integrated-circuit portion (BN2) corresponding to said digital block, is produced in a shrunk technological version associated with said native technology.

8 Claims, 5 Drawing Sheets

PROCESS FOR FABRICATING AN INTEGRATED CIRCUIT COMPRISING AN ANALOG BLOCK AND A DIGITAL BLOCK, AND CORRESPONDING INTEGRATED CIRCUIT

FIELD OF THE INVENTION

The invention relates to integrated circuits and more particularly to their fabrication. The invention applies advantageously, but not limitingly, to the fabrication of integrated circuits comprising an analog block and a digital block and corresponding to a product having undergone an evolution, for example, an increase in memory, relative to an initial product.

BACKGROUND OF THE INVENTION

An initially designed product, comprising an analog block (i.e. for example a block essentially processing analog signals) and a digital block (i.e. for example a block essentially processing digital signals), may undergo structural and/or functional evolutions resulting in versions in which the size of the digital block has increased. In general, the initial version of the product, possessing an initial footprint, would have been produced in a native technology, for example a 120 nanometer CMOS technology, and the analog part and the digital part of the integrated circuit would be produced within the same substrate, generally with a seal ring, in practice of rectangular shape, surrounding the digital block and the analog block.

It is then particularly advantageous for the final version of the product to be technologically produced, that is to say the version in which the enlarged digital block projects beyond the seal ring, in such a way that at the end the footprint of the product on the substrate is the same, that is to say the modified analog and digital blocks still remain within the seal ring.

When the native technology possesses a shrunken version and the enlargement of the digital block in the final version of the product is not too great compared with the size of the digital block in the initial version of the product, it is then possible to use the shrunken technological version of the native technology to produce the integrated circuit so as in the end to reduce its footprint on the silicon. To give an example, the shrunken version of 120 nanometer CMOS technology is a 110 nanometer CMOS technology.

One approach includes enlarging the size of the analog block so as to apply a homogeneous homothetic reduction towards the shrunken technological version on the entire integrated circuit.

According to this method, the enlargement of the analog block is performed at the design stage of this block so as to obtain, at the design stage, a single digital file (file GDSII for example) representative of both the analog block and the digital block. Furthermore, it is from this single file that mask files are conventionally prepared.

However, such a method has drawbacks. More precisely, before enlargement, the geometric structures of the various elements coincide with the design gate used for the design. However, after enlargement, this coincidence is destroyed. Therefore, a rounding is automatically applied on all the critical geometries so as again to make them coincide with the gate pitch, which may in fine lead to problems. This situation is all the more critical the more advanced the technology, i.e. the finer the etching corresponding to the gate length of the transistors.

Moreover, the design rule checks or DRCs become increasingly difficult to manage and the optical proximity corrections or OPCS run the risk of no longer being controlled (erratic fragmentation).

SUMMARY OF THE INVENTION

According to one method of implementation and one embodiment, the invention provides in particular an integrated-circuit fabrication process that modifies the analog block as little as possible, so as to have the same pairing of transistors as that provided in the native technology.

According to one method of implementation, the invention proposes to form the processing stream so as to obtain the mask data on each block separately, optionally with a few modifications, and then to assemble the two files thus obtained in order to generate the final mask files. With such a method of implementation, the dimensional optical proximity corrections may be applied in a controlled manner to the various critical mask levels.

Thus, according to one aspect, there is a process for fabricating an integrated circuit comprising an analog block and a digital block, the process comprising a design of the analog block and of the digital block and the technological production of the blocks thus designed in and/or on the same substrate.

According to a general feature of this aspect, the design of the analog block and the design of the digital block are taken from a library of components defined in a native technology having an associated shrunken technological version, and the technological production comprises the production in the native technology of at least part of a first integrated-circuit portion corresponding to the analog block, and the production in the shrunken technological version associated with the native technology of a second integrated-circuit portion corresponding to the digital block.

In other words, according to this aspect, the dimensional reduction applied is not homogeneous but selective over the entire integrated circuit. More precisely, the homothetic dimensional reduction is applied on the digital part, and thus the analog block, which is a particularly complex block to characterize and validate technologically, is thus altered as little as possible.

Although it is possible to produce the entire analog block in the native technology, it is preferable for the dimensions of the contacts, i.e. the electrical links between, on the one hand, the active zones of the silicon, for example source and drain regions, and the gate regions of the transistors and, on the other hand, the first metallization level of the integrated circuit, and also the dimensions of the vias (i.e. the electrical interconnects between two metallization levels), to be aligned on the dimensions in the most critical technology, i.e. in this case the shrunken technological version associated with the native technology. This makes it possible, using the same etching process, to guarantee correct production of cavities in which the contacts and the vias will be formed, in whatever part of the integrated circuit.

Thus, according to one method of implementation, the technological production comprises the production in the native technology of the first integrated-circuit portion (that corresponding to the analog block) with the exception of the contacting areas on the active gate regions and zones (and consequently contacts) and electrically conductive interconnects between the metallization levels, the dimensions of which are shrunken so as to be aligned respectively on those of the contacting areas and of the interconnects of the second integrated-circuit portion, i.e. that corresponding to the digital block.

According to one method of implementation, the design of the analog block comprises the construction of a first initial file representative of the electronic content of the analog block in the native technology. The design also includes the production of the first integrated-circuit portion comprises a construction, based on the first initial file, of a first intermediate file representative in the native technology, taking into account the possible dimensional reduction in the contacting areas and the interconnects, of the content of all the levels of the first integrated-circuit portion.

Moreover, the design of the digital block also comprises the construction of a second initial file representative of the electronic content of the digital block in the native technology and the production of the second integrated-circuit portion comprises a construction, based on the second initial file, of a second intermediate file representative in the shrunken technological version, of the content of all the levels of the second integrated-circuit portion.

The technological production further comprises a combination of the first intermediate file and the second intermediate file.

In other words, according to this method of implementation, the flow of operations for obtaining the mask data on each of the two blocks is treated separately, and then the two files are merged so as to generate the final mask files.

According to another aspect, the technological production just mentioned make it possible for the two blocks, when the analog block is located, after its design from a library of components defined in the native technology within a template, for example the location of the future seal ring, whereas the digital block overlaps the template after its design, to be located, after the technological production, in and/or on the same substrate within the template.

According to another aspect, the invention provides an integrated circuit comprising an analog block and a digital block in and/or on the same substrate.

According to a general feature of this other aspect, at least part of a first integrated-circuit portion corresponding to the analog block is produced in a native technology and a second integrated-circuit portion corresponding to the digital block is produced in a shrunken technological version associated with the native technology.

According to one embodiment, the first integrated-circuit portion comprises contacting areas on electrically active regions and electrically conductive interconnects between the metallization levels, the dimensions of which are aligned respectively on those of the contacting areas and of the interconnects of the second integrated-circuit portion.

According to another embodiment, the overlap region between a metal line of the first metallization level and a contact is larger in the first integrated-circuit portion, i.e. in that relating to the analog block, than in the second integrated-circuit portion, i.e. that relating to the digital block. Likewise, the overlap region between a metal line of a metallization level of rank n and an interconnect (via) of rank n is larger in the first integrated-circuit portion than in the second integrated-circuit portion.

BRIEF DESCRIPTION OF THE DRAWINGS

Other advantages and features of the invention will become apparent on examining the detailed description of entirely non-limiting methods of implementation and embodiments, and from the appended drawings in which.

DETAILED DESCRIPTION OF THE PREFERRED EMBODIMENTS

Figure 1:
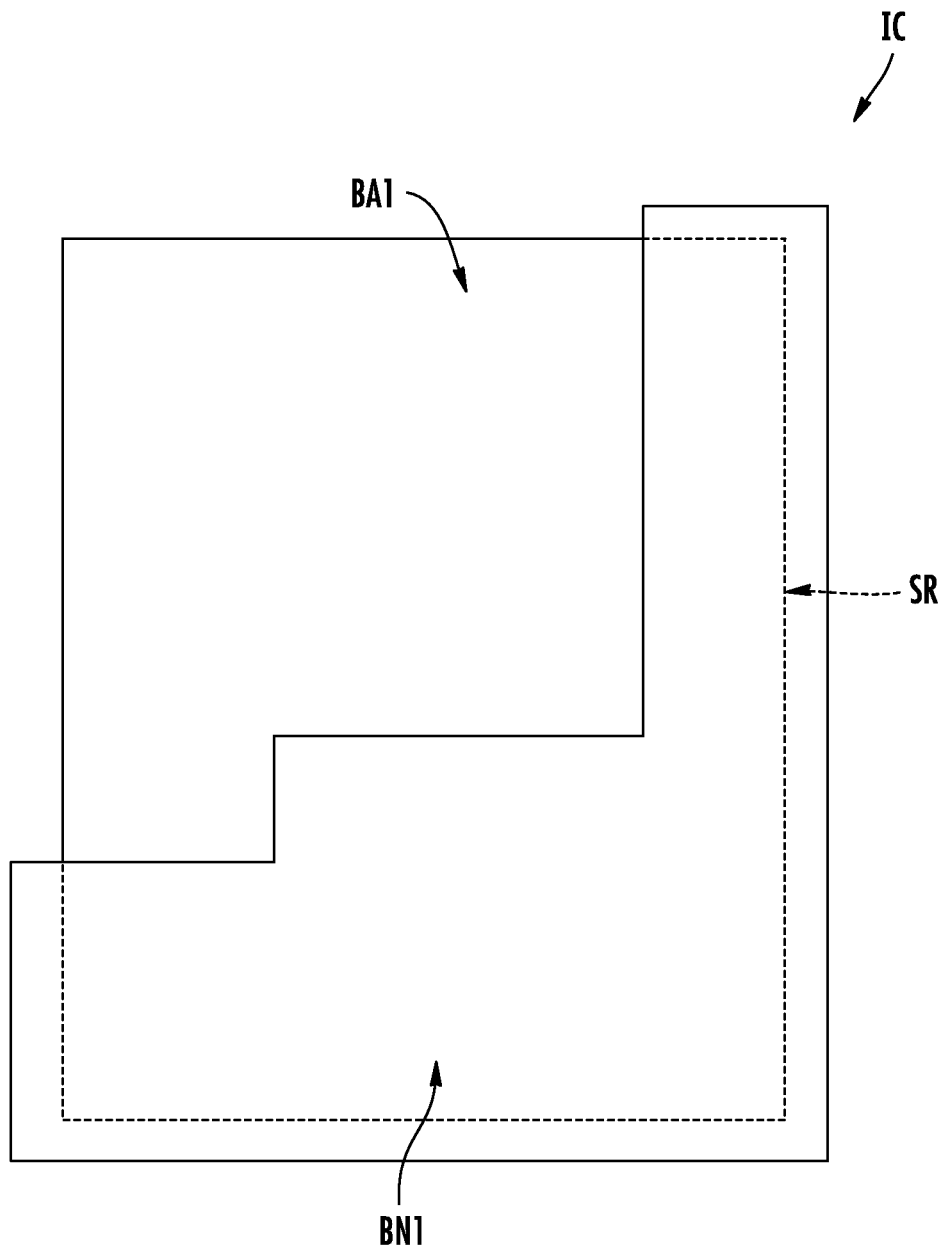
FIG. 1 shows an integrated circuit according to the present invention.

In FIG. 1, the reference IC denotes an integrated circuit comprising an analog block BA1 and a digital block BN1.

The analog block is to process analog signals and comprises, for example, mixer stages, intended for performing frequency transpositions, filters, oscillators, etc. The digital block is intended for processing digital signals and comprises, for example, a microcontroller, the associated memory and the corresponding logic, also called by those skilled in the art "glue logic".

In an initial version of the product, the digital block has a smaller footprint than that shown in FIG. 1. Specifically, the analog block and the digital block of the integrated circuit in its initial version would be within a template represented here by the location of the rectangular seal ring SR. This seal ring prevents in particular the penetration of contaminants into the integrated circuit while the semiconductor wafer is being sawn.

In its initial version, the integrated circuit was produced in a native technology, for example 120 nanometer technology. Because, for example, of a functional evolution of the product, desiring for example the memory size to be increased, the digital block BN1 has a greater footprint and, after its design, therefore overlap the template bounded by the initial location of the seal ring SR.

As a consequence, if this digital block BN1 thus designed is also made in the previously used native technology, i.e. for example the 120 nanometer technology, the technological production of the integrated circuit would result in a larger footprint on the silicon.

Figure 2:
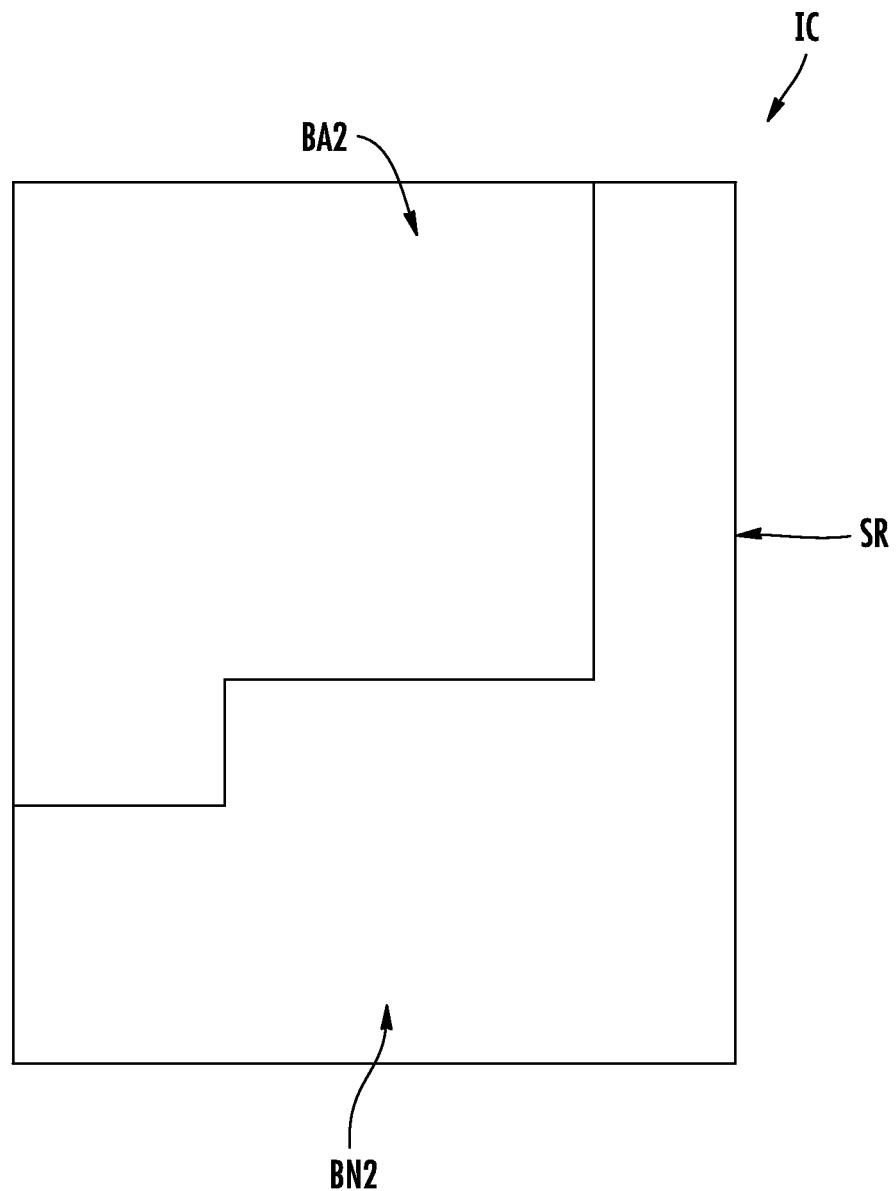
FIG. 2 shows another embodiment of the integrated circuit according to the present invention.

According to one method of implementation and one embodiment, it is therefore proposed, as illustrated in FIG. 2, to return, after technological production, the evolved version of the integrated circuit of FIG. 1 inside the seal ring SR.

In this regard, the integrated circuit IC comprises a first portion BA2 corresponding to the analog block and a second portion BN2 corresponding to the digital block.

At least part of the first portion BA2 is produced in the native technology whereas the second portion BN2 is produced in the shrunken technological version associated with the native technology.

By way of indication, when the native technology is 120 nanometer CMOS technology, the shrunken technological version is 110 nanometer CMOS technology (10% homothetic shrinkage factor).

In fact, as will be seen in greater detail below, the entire first portion BA2 is produced in the native technology, with the exception of the contacting areas on the active zones and on the gates of the transistor, and consequently the contacts between these regions and the first metallization level of the integrated circuit, and interconnects or vias between the metallization levels of the integrated circuit. Specifically, the dimensions of these contacts and these vias are aligned respectively on those of the contacts and of the vias of the second portion BN2 of the integrated circuit IC. This redimensioning allows a single etching recipe to be used.

Thus, by way of example, it is possible, while modifying the analog block as little as possible, to reduce the footprint of the integrated circuit so as to pass, for example, from an area up to 12.25 mm$^2$ (FIG. 1) to an area of 11 mm$^2$ (FIG. 2).

Figure 3:
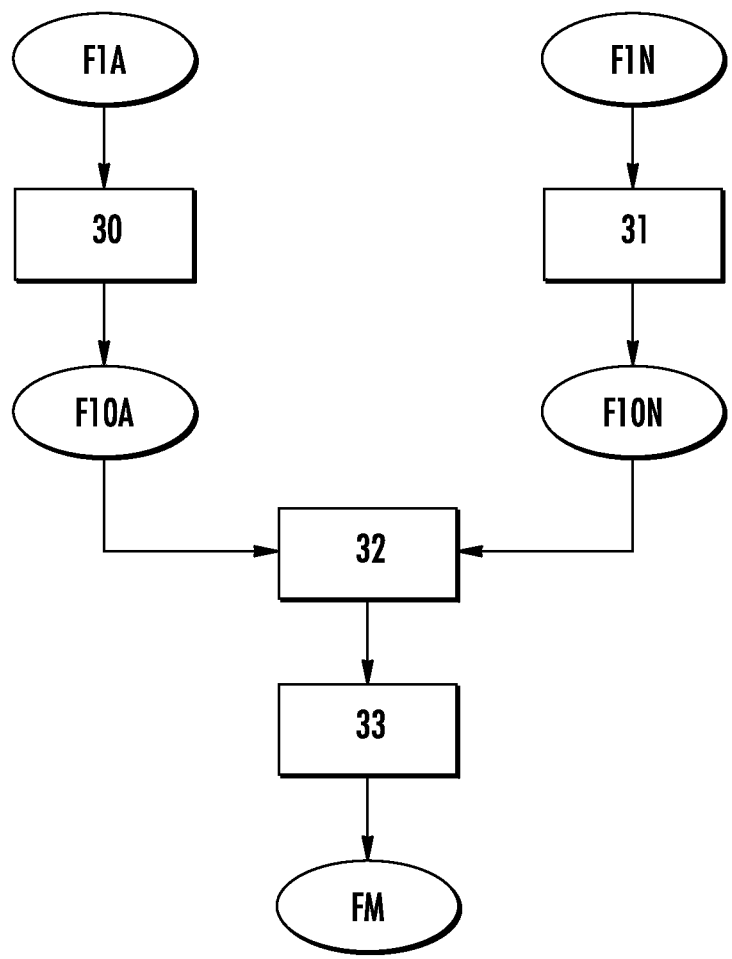
FIG. 3 is a flowchart of a method of making the integrated circuit of FIG. 2.

To illustrate one example of implementing a process for obtaining the integrated circuit of FIG. 2, reference will now be made more particularly to FIG. 3. During the design, the analog block is produced from a library of components defined in the native technology, in this case the 120 nanometer CMOS technology. Thus, an initial file, for example a file in the GDSII format, representative of the electronic structure (components and interconnects between the components) of the analog block, is constructed. This first initial file is referenced F1A in FIG. 3 and is for example obtained using design tools such as those supplied by the United States company CADENCE.

Likewise, the digital block is produced, during its design, from components also available from a library defined in the native technology. A second initial file FIN is therefore obtained.

Next (step 30), a first intermediate file F10A, for example also in GDSII format, representative of the content of all the levels of the first integrated-circuit portion, i.e. representative of all the levels of the analog block and in the native technology, taking into account the aforementioned possible dimensional reduction of the contacts, contacting areas and interconnects, is constructed from the first initial file F1A.

The data in the file F10A represent mask data before linear or OPC-type dimensional corrections and are obtained conventionally from the file F1A by a known conventional conversion tool, for example a tool sold by the company MENTOR GRAPHICS under the brand name CALIBRE.

The CALIBRE tool is also applied (step 31) to the second initial file F1N in order to provide a second intermediate file F10N representative, in the shrunken technological version, of the levels of the integrated-circuit portion corresponding to the digital block.

In this regard, the CALIBRE tool is parameterized so as to apply, during this operation, a 0.9 homothetic shrinkage factor in order to go from the 120 nanometer native technology to the 110 nanometer shrunken technological version.

The two files F10A and F10N are then combined in a step 32. This combining operation comprises a relative spatial repositioning on the geometric structure of masks corresponding to the digital block so as to take into account any offset (change of origin in an orthonormal reference frame) between the two files, said offset resulting from the homothetic shrinkage performed only on the digital block. This combining of the two files in GDSII format is performed for example using a tool again supplied by the company XYALIS under the name GTSuite. This makes it possible in particular to manage possible collisions of subfiles having identical names.

Next, in step 33, post-processing operations, comprising especially optical proximity corrections (OPCs), are applied to the resulting file obtained after step 32.

Lastly, the final mask files FM for each level of the integrated circuit are obtained. The integrated circuit is then fabricated based on the physical masks written by the mask supplier on the basis of the final mask files FM.

As mentioned above, a dimensional reduction may be performed within step 30 so as to make it possible for the dimensions of the contacts and of the vias of the integrated-circuit portion corresponding to the analog block to be aligned on those of the vias and of the contacts of the integrated-circuit portion corresponding to the digital block.

Figure 4:
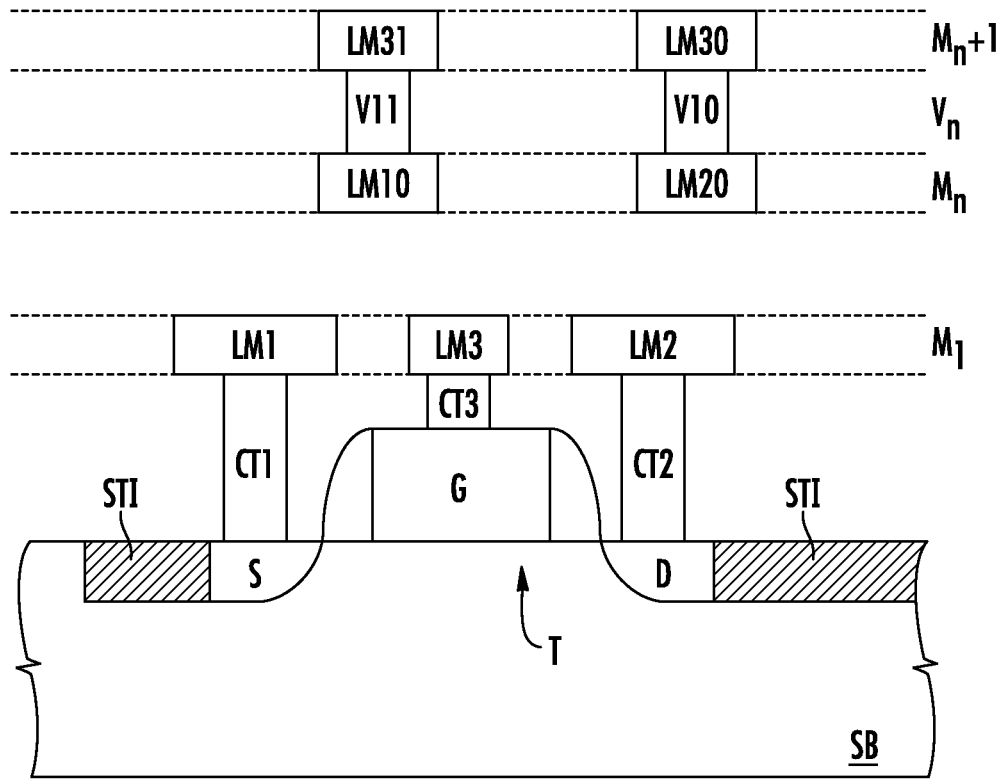
FIG. 4 shows a cross sectional view of the integrated circuit of FIG. 2.

As schematically illustrated in FIG. 4, an integrated circuit comprises, within a substrate SB, active components, for example transistors, laterally isolated by isolating regions, for example shallow trench isolations STIs.

The source, drain and gate regions are connected to the metal lines LM1, LM2 and LM3 respectively by metal links commonly referred to by those skilled in the art as "contacts" CT1, CT2 and CT3. Moreover, between the metallization level $M_n$ of rank n of the integrated circuit and the metallization level of rank n+1, they are electrical interconnects or vias $V_n$, of rank n, enabling metal lines, for example the lines LM10 and LM20 of metallization level $M_n$, to be connected to other metal lines LM30, LM31 of the metallization level $M_{n+1}$ by vias V10 and V11.

Through step 30, the conversion tool is therefore parameterized so as to apply, in the example described here (going from 120 nanometer technology to 110 nanometer technology), a dimensional reduction of B nanometers per side in respect of the contacts, 9.5 nanometers per side in respect of the vias of rank 1, 2, 3 and 4, and 18 nanometers per side in respect of the vias of rank 5.

Regarding, the length of the polysilicon gates of the transistors in the analog part, it is preferable for these not to be modified. Two cases are therefore possible. Either the OPC correction model applied in step 33 does not dimensionally modify the polysilicon lines and, in this case, no dimensional corrections are applied in step 30 to the polysilicon lines. Or, in the case in which the OPC model results for example, in step 33, in a broadening of the polysilicon lines, an identical shrinkage is then applied, in step 30, to the polysilicon lines so as to obtain in fine a zero dimensional variation.

Figure 5:
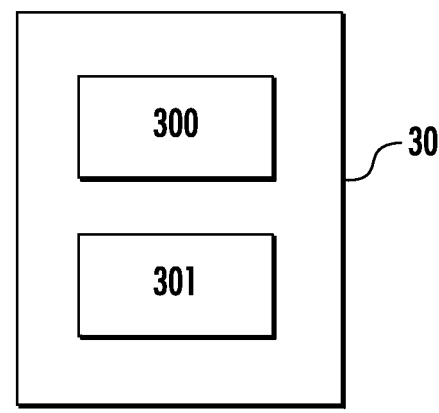
FIG. 5 is a schematic block diagram of the integrated circuit of FIG. 2.

The dimensional reduction performed on the contacts in step 30 is illustrated schematically by the block 300 in FIG. 5, whereas the dimensional reduction performed on the vias is shown schematically by the block 301 in FIG. 5.

Figure 6:
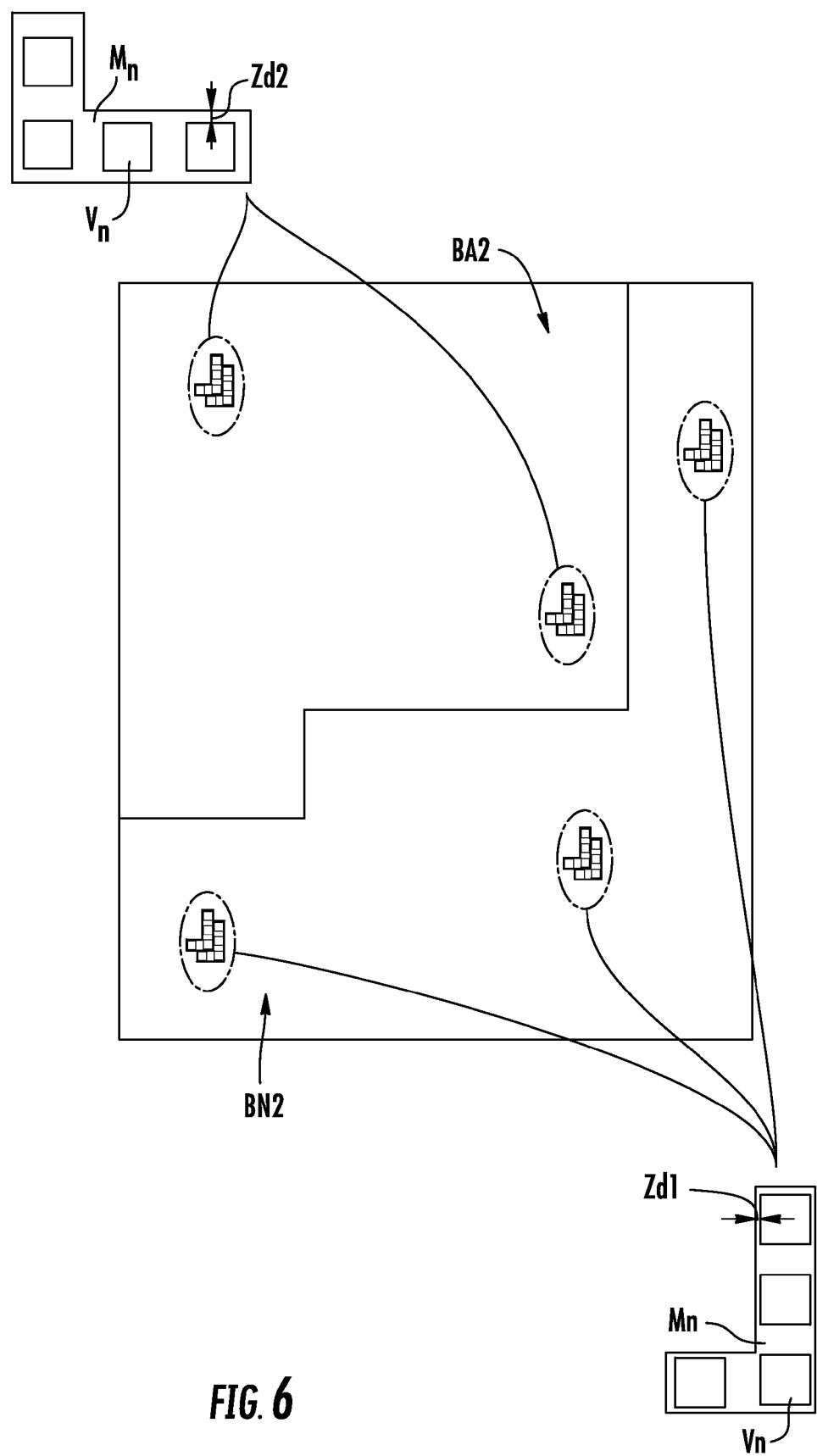
FIG. 6 is another schematic block diagram of the integrated circuit of FIG. 2.

This dimensional reduction performed in step 30 results, as may be seen in FIG. 6, in a dimensional alignment of the vias $V_n$ (and of the contacts) between the portion BA2 (the analog block) of the integrated circuit and the portion BN2 (the digital block) of the integrated circuit.

However, the overlap region Zd2 between a metal line of the metal level $M_n$ of rank n and the via $V_n$ of rank n is greater in the analog part than the homologous overlap region Zd1 of the digital part BN2.

That which is claimed:

1. A process for fabricating an integrated circuit comprising an analog block and a digital block, the process comprising:
   designing the analog block and the digital block to be on a same substrate;
   the designing of the analog block and the designing of the digital block comprising taking each design from a library of components, the library of components defined in a native technology and having an associated shrunken technological version for
   the library of components;
   the designing of the analog block comprising
      generating a first initial file representative of the analog block in the native technology, and
      constructing, based on the first initial file, a first intermediate file representative in said native technology of at least part of the analog block and a dimensional reduction in contacting areas on electrically active regions and electrically conductive interconnects between metallization levels;

the designing of the digital block comprising generating a second initial file representative of the digital block in the native technology, and constructing, based on the second initial file, a second intermediate file representative in said shrunken technological version of all of said digital block; and generating at least one mask file based upon the analog and digital blocks and a combination of the first intermediate file and the second intermediate file.

2. The process according to claim 1, wherein the dimensional reduction of the metallization levels is so as to be aligned respectively on those of the contacting areas and of the interconnects of said digital block.

3. A process for fabricating an integrated circuit comprising an analog block and a digital block, the process comprising:

designing the analog block from a library of components defined in a native technology within a template;

designing the digital block to overlap the template from a library of components defined in the native technology;

the analog and digital blocks to be located on a same substrate as said template;

the designing of the analog and digital blocks comprising generating a first initial file representative of the analog block in the native technology, constructing, based on the first initial file, a first intermediate file representative in said native technology of at least part of the analog block and a dimensional reduction in contacting areas on electrically active regions and electrically conductive interconnects between metallization levels, generating a second initial file representative of the digital block in the native technology, and constructing, based on the second initial file, a second intermediate file representative in said shrunken technological version of all of said digital block; and generating at least one mask file based upon the analog and digital blocks and a combination of the first intermediate file and the second intermediate file.

4. The process according to claim 3, wherein the dimensional reduction of the metallization levels is so as to be aligned respectively on those of the contacting areas and of the interconnects of said digital block.

5. A process for designing an integrated circuit comprising an analog block and a digital block, the process comprising:

designing the analog block and the digital block;

at least portions of the design of the analog block and at least portions of the design of the digital block being taken from a library of components defined in a native technology having an associated shrunken technological version;

generating a first initial file representative of the analog block in the native technology;

constructing, based on the first initial file, a first intermediate file representative in said native technology of at least part of the analog block and a dimensional reduction in contacting areas on electrically active regions and electrically conductive interconnects between metallization levels;

generating a second initial file representative of the digital block in the native technology;

constructing, based on the second initial file, a second intermediate file representative in said shrunken technological version of all of said digital block; and generating at least one mask file based upon the analog and digital blocks and a combination of the first intermediate file and the second intermediate file.

6. A The process according to claim 5, wherein the dimensional reduction of the metallization levels is so as to be aligned respectively on those of the contacting areas and of the interconnects of said digital block.

7. A process for designing an integrated circuit comprising an analog block and a digital block, the process comprising:

designing the analog block from a library of components defined in a native technology within a template;

designing the digital block to overlap the template from a library of components defined in the native technology;

designing the analog and digital blocks on a same substrate by at least generating a first initial file representative of the analog block in the native technology, constructing, based on the first initial file, a first intermediate file representative in said native technology of at least part of the analog block and a dimensional reduction in contacting areas on electrically active regions and electrically conductive interconnects between metallization levels, generating a second initial file representative of the digital block in the native technology, and constructing, based on the second initial file, a second intermediate file representative in said shrunken technological version of all of said digital block; and generating at least one mask file based upon the analog and digital blocks and a combination of the first intermediate file and the second intermediate file.

8. The process according to claim 7, wherein the dimensional reduction of the metallization levels is so as to be aligned respectively on those of the contacting areas and of the interconnects of said digital block.

* * * * *